United States Patent
Pham-Van-Diep et al.

(10) Patent No.: US 6,955,120 B2
(45) Date of Patent: Oct. 18, 2005

(54) PRESSURE CONTROL SYSTEM FOR PRINTING A VISCOUS MATERIAL

(75) Inventors: Gerald C. Pham-Van-Diep, Hopkinton, MA (US); Patsy Anthony Mattero, Smithfield, RI (US); Randy Leon Peckham, North Scituate, RI (US); Gary Freeman, Beverly, MA (US); Joseph A. Perault, Natick, MA (US); Richard Willshere, Weymouth (GB)

(73) Assignee: Speedline Technologies, Inc., Franklin, MA (US)

(*) Notice: Subject to any disclaimer, the term of this patent is extended or adjusted under 35 U.S.C. 154(b) by 72 days.

(21) Appl. No.: 10/402,418

(22) Filed: Mar. 28, 2003

(65) Prior Publication Data

US 2004/0187716 A1 Sep. 30, 2004

(51) Int. Cl.[7] ............................................. B41L 27/00
(52) U.S. Cl. ........................................ 101/123; 101/124
(58) Field of Search ................................. 101/114, 123, 101/124, 129, 155, 157, 167, 169; 118/213, 406, 422, 429

(56) References Cited

U.S. PATENT DOCUMENTS

| | | | |
|---|---|---|---|
| 4,622,239 A | * | 11/1986 | Schoenthaler et al. ........ 427/96 |
| RE34,615 E | | 5/1994 | Freeman |
| 5,524,537 A | * | 6/1996 | van der Meulen .......... 101/120 |
| 5,715,748 A | * | 2/1998 | Murakami et al. .......... 101/114 |
| 5,802,970 A | * | 9/1998 | Tani ............................ 101/123 |
| 5,806,423 A | * | 9/1998 | Tani ............................ 101/123 |
| 5,947,022 A | | 9/1999 | Freeman et al. |
| 6,171,399 B1 | | 1/2001 | Kaiser et al. |
| 6,324,973 B2 | | 12/2001 | Rossmeisl et al. |
| 6,453,810 B1 | | 9/2002 | Rossmeisl et al. |
| 6,495,199 B1 | | 12/2002 | Kaiser et al. |
| 6,541,063 B1 | | 4/2003 | Prentice et al. |
| 6,571,701 B1 | | 6/2003 | Pham-Van-Diep et al. |
| 2002/0038814 A1 | | 4/2002 | Mimura et al. |

FOREIGN PATENT DOCUMENTS

| | | |
|---|---|---|
| EP | 1 197 267 A1 | 4/2002 |
| FR | 2 782 945 A1 | 3/2000 |

OTHER PUBLICATIONS

International Search Report for PCT/US2004/009473 mailed Jul. 28, 2004.

* cited by examiner

*Primary Examiner*—Ren Yan
(74) *Attorney, Agent, or Firm*—Lowrie, Lando & Anastasi, LLP (57) ABSTRACT

A printer includes a print head for dispensing viscous material, such as solder paste. The print head defines a chamber and includes at least one source port and a dispensing slot. Within the chamber, a flexible membrane segregates the chamber into a dispensing region and an activation region. Viscous material flows from a supply mounted to the source port, into the dispensing region and out the slot. A displacement mechanism is positioned to displace the flexible membrane to reduce the volume of dispensing region and to thereby dispense viscous material through the slot. The print head also includes a removable envelope through which the viscous material flows and contacts as it passes through the envelope.

11 Claims, 9 Drawing Sheets

PRESSURE CONTROL SYSTEM FOR PRINTING A VISCOUS MATERIAL

BACKGROUND

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system is used to align the circuit board with the stencil. Such a stencil printer is described and depicted in U.S. Pat. No. RE 34,615, entitled, "Video Probe Aligning of Object to be Acted Upon," which is incorporated herein by reference in its entirety.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge such as that manufactured by Systems Engineering and Management Co. (SEMCO), Vista, Calif. USA.

In some stencil printers, any excess solder paste remaining under the squeegee, after it has fully traversed the stencil, remains on the stencil when the squeegee is returned to its initial position for printing on a second circuit board. In some screen printers, a second squeegee moves across the stencil in the direction opposite to that of the first squeegee. The first squeegee and the second squeegee are used on alternating boards to continually pass the roll of solder paste over the apertures of a stencil to print on each successive circuit board. In the stencil printers that utilize two squeegees, there is still the problem that at the end of a manufacturing day, or when the stencil is to be changed, excess solder paste typically remains on the stencil and must be manually removed. Also, in these known printers, it is difficult to maintain a desirable viscosity because volatile solvents escape from the solder paste, thereby affecting the viscosity of the solder paste.

In these stencil printers, the squeegee blades are typically at a predetermined angle with respect to the stencil to apply downward pressure on the solder paste to force the solder paste through the apertures in the stencil as the squeegee is moved across the stencil. The angle of the blade is selected based on the speed at which the blade traverses the stencil and based on the desired downward pressure on the solder paste from the blade. It is desirable to maintain a consistent pressure on the solder paste as the squeegee traverses the stencil; however, in a typical printer, the pressure varies due to variations in paste viscosity throughout a production run and due to variations in the angle of the squeegee caused by deformation of the squeegee due to the pressure applied by the squeegee driving device.

Responding to some of the problems, noted above, improved solder-paste print heads are described in U.S. Pat. Nos. 5,947,022, 6,324,973 and 6,453,810, each of which are incorporated herein by reference in their entirety. These patents describe a movable print head having a cylindrical chamber including ports to which removable cartridges that supply solder paste are coupled. Solder paste is passed from the removable cartridges, into the cylindrical chamber, then out of a dispensing slot, through a stencil and onto a circuit board in a desired pattern.

SUMMARY

The improved print head disclosed herein includes a chamber with a direct pressure control system for discharging viscous material from the chamber. A "viscous" material is a material that has a viscosity sufficient under the given configuration and conditions such that the material will not naturally (under simple gravitational principles) flow without other external forces to fill and dispense from a dispensing region within the chamber.

More specifically, a viscous-material print head (also known as a "dispensing head") of this disclosure has a chamber through which viscous material (e.g., solder paste) can be channeled. The print head includes at least one source port that can be coupled with a source of viscous material, such as a solder-paste cartridge, and a dispensing slot through which the viscous material can exit the chamber. The chamber is segregated by a flexible membrane into an activation region and a dispensing region.

In operation, the viscous material is directed from the source through the source port and into the dispensing region of the chamber. A displacement mechanism applies pressure to the membrane in the chamber's activation region to displace the membrane, which displaces the viscous material on the other side of the membrane out of the chamber's dispensing region through the dispensing slot. The displacement mechanism can be a compressed gas (e.g., air) source controlled by a computer and coupled with the activation region to increase the gas pressure in the activation region.

In one embodiment, the flexible membrane is bonded to a polymer envelope that defines the activation and dispensing regions of the chamber. The envelope can include all surfaces contacted by the adhesive material within the chamber, and the housing of the print head can be detachable to release the envelope for cleaning and replacement.

The print head can be mounted to a frame, to which a stencil is also mounted. The stencil is positioned between the dispensing slot of the print head and the substrate (e.g., a printed circuit board). Viscous material can accordingly be dispensed from the print head through apertures in the stencil and onto selected locations on the surface of the substrate.

Because direct pressure is applied within the chamber to displace viscous material out of the print head, the dispensing region of the print head can be substantially smaller than the undivided chambers of earlier solder-paste print heads. Use of a print head having a membrane defining an activation region and a relatively small dispensing region provides several advantages. For example, reducing the size of the region where viscous material is contained (i.e., the dispensing region) reduces the amount of viscous material within the chamber; as a consequence, less viscous material is wasted at the end of a printing operation or when there is a changeover of the material being printed. Further, the small dispensing region increases the speed with which material changeover can be performed. Further still, the small dispensing region promotes better mixing of the viscous material within the chamber during the printing process to prevent, reduce or delay separation and segregation of components within the viscous material. Moreover, the print head can be used to print a variety of materials having a broader range of viscosities due to the small dispensing region.

The displacement mechanisms described herein can also respond rapidly to a pressure drop, which may occur, e.g., when dispensed solder paste enters a "through hole" in a printed circuit board. The response is provided by activating the displacement mechanism to directly impart pressure against the viscous material at a location very close to the stencil to dispense additional viscous material. In contrast, the response time of previous print heads was typically too slow to compensate for the depletion produced at the through hole before the print head had passed beyond the through hole in its passage across the surface of the board. Further still, use of a flexible membrane that exhibits small deflections produces minimal loss of force compared with the losses occurring with, e.g., a translating piston due to leakage and the friction that accompanies the displacement of the piston and viscous material along the walls of the chamber. Where the flexible membrane is part of an envelope, a separable housing structure also enables easy cleaning and replacement of surfaces contacting the viscous material after printing.

Additionally, provided the displacements of the flexible membrane are small, the pressure transfer from the compressed gas to the viscous material is subject to negligible losses unlike those achieved with a translating piston, where friction and leakage along the walls of the piston can result in substantial losses in efficiency.

Further still, the removable envelope, including the membrane, disclosed herein offers substantial advantages in terms of ease of cleaning and replacement thereof.

Finally, the substantially vertical and parallel facing surfaces of blades in embodiments described herein offer advantages in printing performance over traditional, inwardly facing blades, such as those illustrated in U.S. Pat. Nos. 6,171,399 and 6,495,199.

BRIEF DESCRIPTION OF THE DRAWINGS

In the accompanying drawings, described below, like reference characters refer to the same or similar parts throughout the different views. The drawings are not necessarily to scale, emphasis instead being placed upon illustrating particular principles of the methods and apparatus characterized in the Detailed Description.

DETAILED DESCRIPTION

For purposes of illustration, embodiments of the present invention are described, below, with reference to a stencil printer used to print solder paste onto a circuit board. The apparatus and methods may also be used in other applications requiring dispensing of other viscous materials such as glues and encapsulants on a variety of substrates. For example, the apparatus may be used to print epoxy for use as underfill for chip-scale packages (typically having a substrate contact surface with an area of about 1 $cm^2$).

Print heads of this invention can be used in stencil printers, such as the ULTRAPRINT 3000 stencil printer and the AP Series stencil printer (both available from Speedline Technologies, Inc. of Franklin, Mass. USA).

Figure 1:
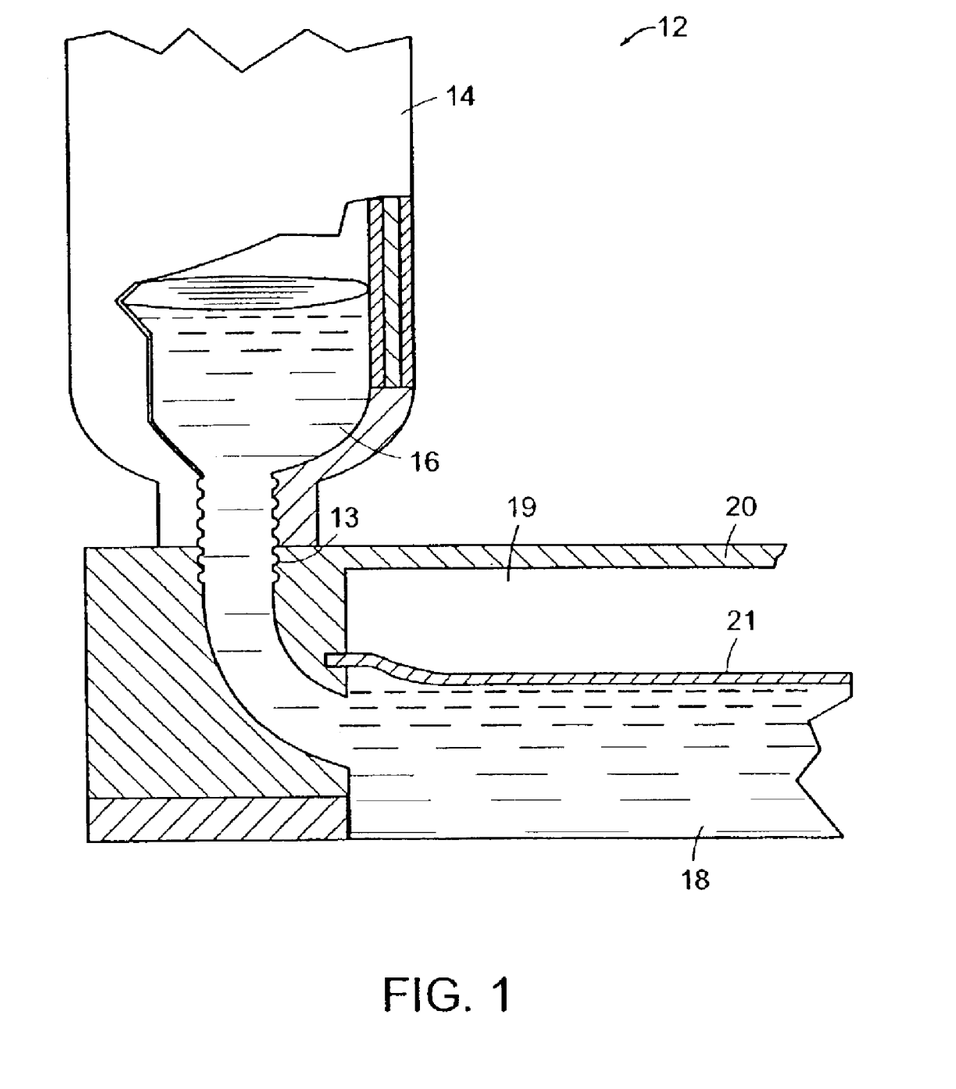
FIG. 1 is a partially cut-away and sectioned view of a print head coupled with a source cartridge of solder paste.

In the embodiment illustrated in FIG. 1, the print head 12 includes source ports 13 (best seen in FIGS. 4–9) at each end configured to receive standard three-ounce or six-ounce solder paste cartridges 14 that provide solder paste 16 to the print head 12 during a printing operation. The cartridges 14 are available from Systems Engineering & Management Co. (SEMCO) of Vista, Calif. USA. Each of the cartridges 14 is coupled to one end of a pneumatic air hose; the other end of the hose is coupled with an air compressor that forces solder paste 16 from the cartridge 14 into the print head 12. As is readily understood by those skilled in the art, the print head 12 can be adapted to receive other standard, or non-standard, cartridges or other sources of solder paste. A mechanical device, such as a piston, may be used in addition to, or in place of, air pressure to force the solder paste from the cartridges 14 into the print head 12.

Any number of source ports can be provided on the print head 12 to couple more or fewer cartridges 14 with the print head 12. The number of cartridges 14 is selected based on the length of the print head 12 and the capacity of the cartridge 14 used. The length of the print head 12 is determined, in part, based on the width of the circuit boards to be printed upon. If the size of the circuit board changes, the print head may be replaced by a new print head having a length sized for the new circuit board. The effective length of the dispensing slot 24, shown in FIG. 3 (where the length is measured along an axis perpendicular to the plane of the illustrated section), may also be reduced to accommodate smaller circuit boards by partially covering a portion of the slot 24. In particular embodiments, the dispensing slot 24 is about 20 cm to about 60 cm (8–24 inches) in length, and the print cartridges 14 are mounted no further than 20 cm apart.

Figure 2:
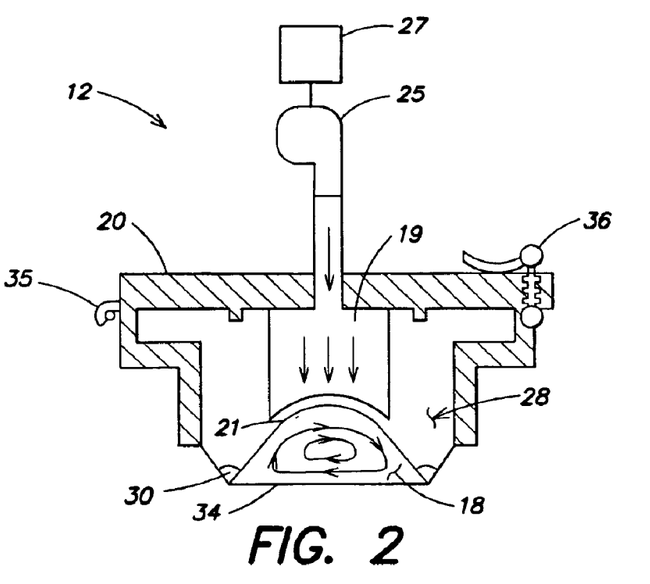
FIG. 2 is a partially cut-away and sectioned illustration of another embodiment of a print head coupled with a source cartridge of solder paste.

The print head 12 includes a housing 20 that defines a chamber. The chamber is segregated by a flexible membrane 21 into an activation region 19 and a dispensing region 18. In particular embodiments, the dispensing region 18 has a length of 20–60 cm and a diameter/width of about 1 cm. The arrows in FIG. 2, illustrate a manner in which viscous material can be churned within the dispensing region 18 during a printing process. The membrane 21 can be formed from a flexible polymer, such as latex or silicone, and is secured to the rest of the envelope 28, for example, with an adhesive or via mechanical compression; alternatively, the membrane 21 and the rest of the envelope 28 can form one integral unit. The flexibility of the membrane 21 can be controlled by controlling its thickness.

Figure 3:
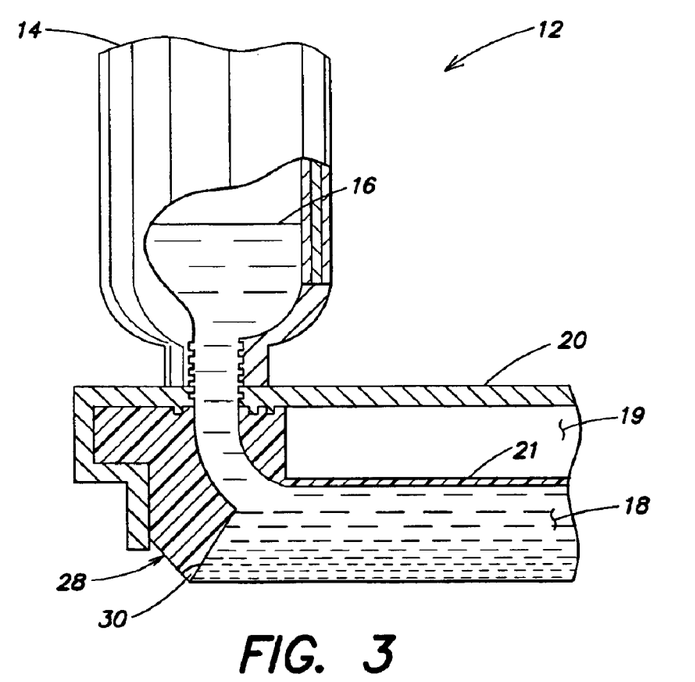
FIG. 3 is a sectioned view of the print head illustrated in FIG. 2 from a perspective rotated 90° horizontal from that of FIG. 2.
Figure 11:
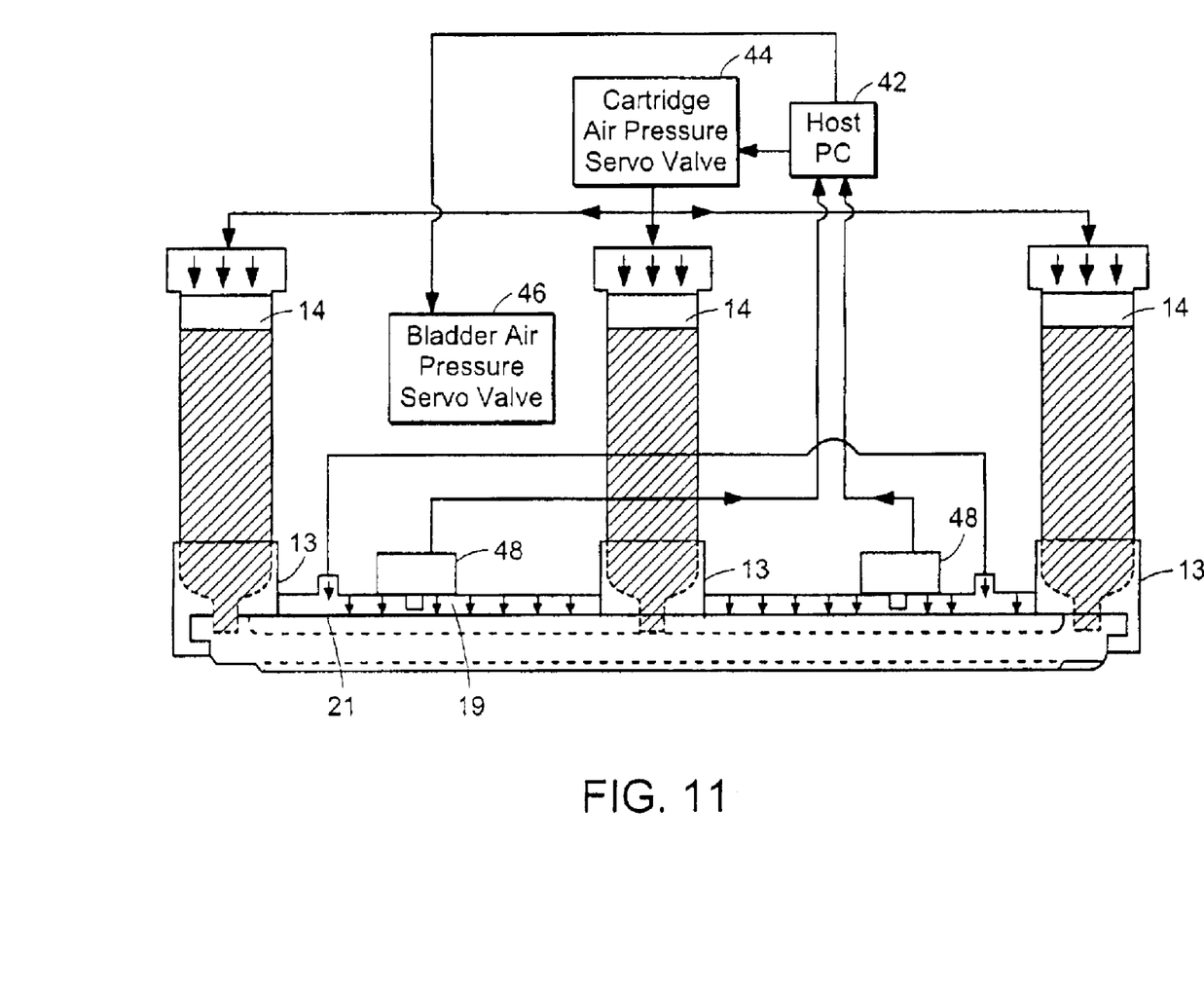
FIG. 11 is a partially schematic illustration of a control system for the print head of FIG. 8.

The activation region 19 is coupled with a compressed air source 25, which is electronically coupled with a controller 27. The controller 27 is programmable to control the pressure generated by the compressed air source 25 and to thereby control the displacement of the flexible membrane 21 into the dispensing region 18. Displacement of the flexible membrane 21 into the dispensing region 18 to displace solder paste 16 as a consequence of compressed air from source 25 is illustrated in FIG. 3. Alternatively, a source of a compressible gas other than air can be used, or a liquid can be used. A control system for regulating displacement of the flexible membrane and for dispensing solder paste from the cartridges is illustrated in FIG. 11 and described, below.

In the embodiment illustrated in FIGS. 2 and 3, the flexible membrane 21 is coupled with an envelope 28 formed of a polymer, such as polyurethane or another type of elastically deformable plastic. The envelope 28 fills the chamber defined by the housing 20 with cavities left for the activation region 19 and dispensing region 18. Accordingly, the envelope 28 can include all parts wetted by the solder paste 16 within the chamber. To ensure integrity of the activation region 19, the interface of the membrane 21 and the envelope 28 can be hermetically secured. The means of coupling the membrane 21 and envelope 28 (e.g., adhesive or mechanical compression) can provide the seal. The housing 20 includes a hinge 35 and a latch 36, which allows two members 32 and 34, which form the top and bottom portions of the housing 20, to be swung open to release the envelope 28 from its containment by the housing 20. The tips 30 of the envelope 28 are formed of a harder polymer, such as high durometric polyurethane, the hardness of which affords longer life.

Figure 4:
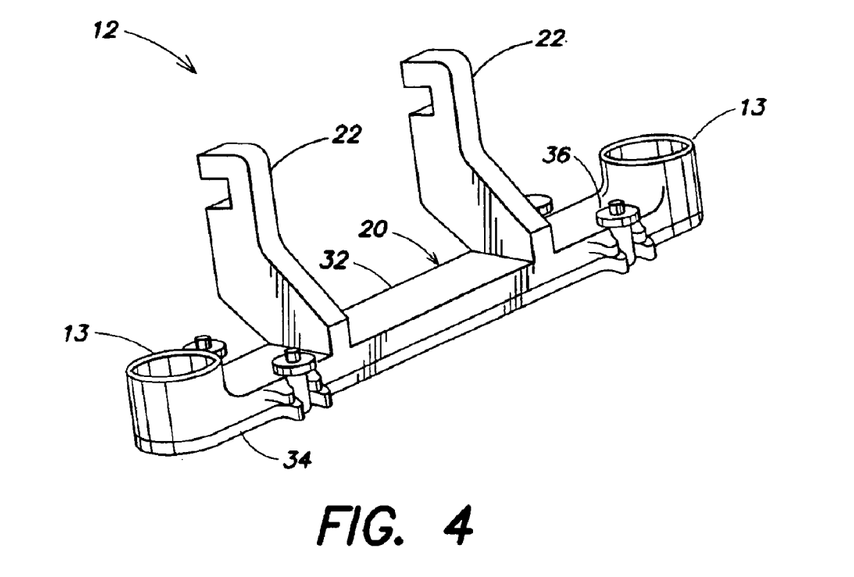
FIG. 4 is a perspective view of a print head.
Figure 5:
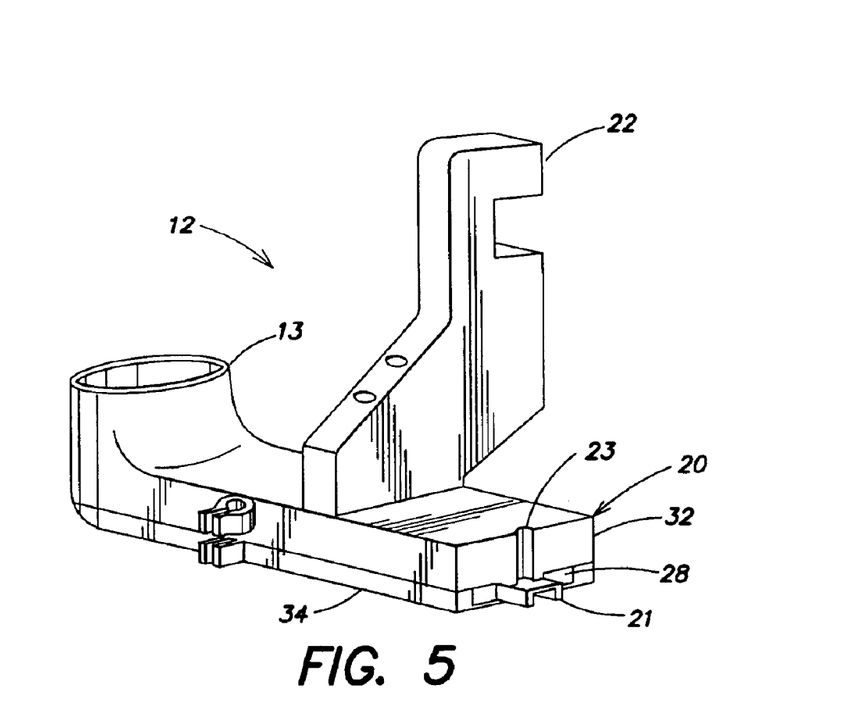
FIG. 5 is a sectioned view of the print head illustrated in FIG. 4.

Additional embodiments of a two-member print head 12, wherein the envelope 28 is contained by the members 32 and 34, is illustrated in the perspective views of FIGS. 4–10. FIG. 4 offers a perspective view of one embodiment of a printhead 12, and the sectioned view of that same print head 12 in FIG. 5 illustrates the positioning and form of the envelope 28 contained within the print head 12. The boring 23 at the sectioned surface of the print head 12 provides a passage to which a compressor can be coupled to supply compressed gas to fill the activation region above the membrane 21.

Figure 6:
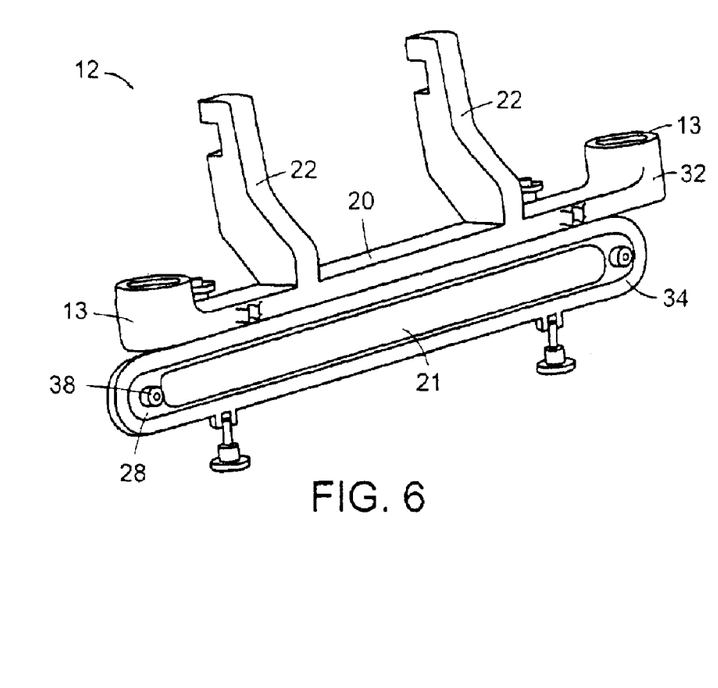
FIG. 6 is another view of the print head of FIG. 4, wherein the lower casing is released.
Figure 7:
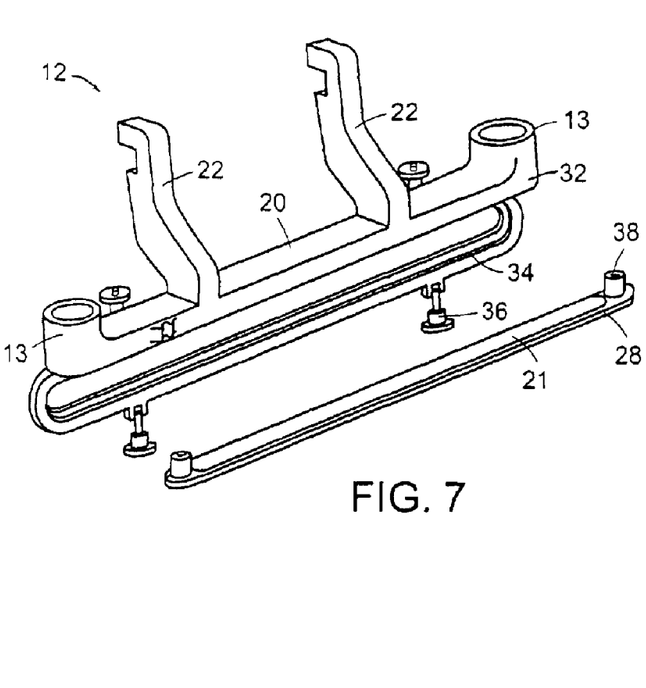
FIG. 7 is yet another view of the print head of FIG. 4, wherein the lower casing is released and the flexible membrane is removed.

As shown in FIGS. 6 and 7, the envelope 28 can be removed from the print head 12 when the latches 36 are released to decouple the members 32 and 34. In this embodiment, where the source ports 13 are positioned on the top member 32, the envelope 28 includes collars 38 that define passages through which the solder paste flows from the cartridge to the dispensing region on the other side of the membrane 21. The structure of the collars 38 allows them to engage with the cartridges 14 such that solder paste from the cartridges contacts only the surfaces of the collars 28 that form the passage to the dispensing region 18 as well as the surfaces of the envelope that define the dispensing region 18, thereby enabling relatively easy clean-up due to the limited number of surfaces in contact with the solder paste.

Figure 8:
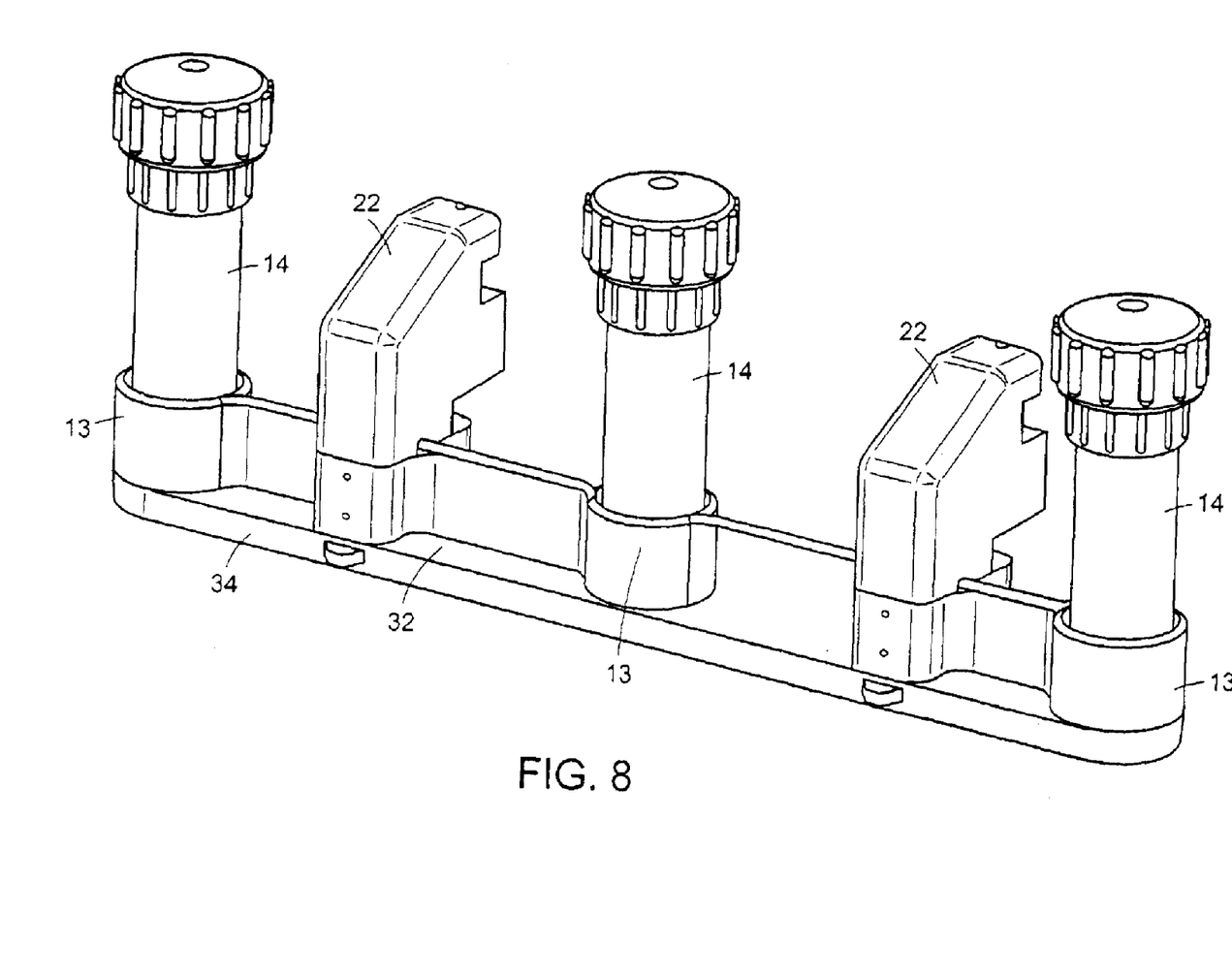
FIG. 8 is a perspective view of another embodiment of a print head.
Figure 9:
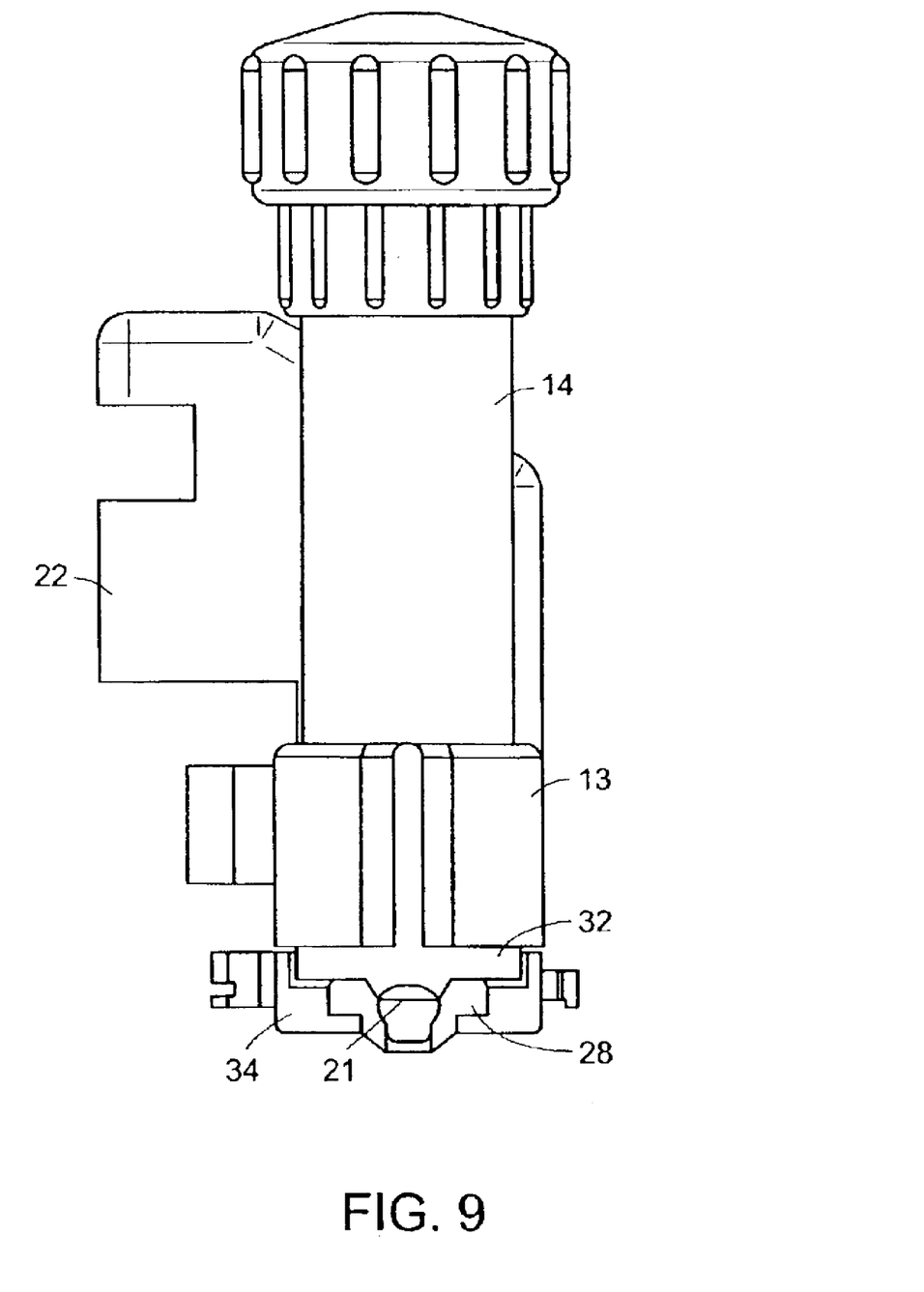
FIG. 9 is a sectional view of the print head of FIG. 8.
Figure 10:
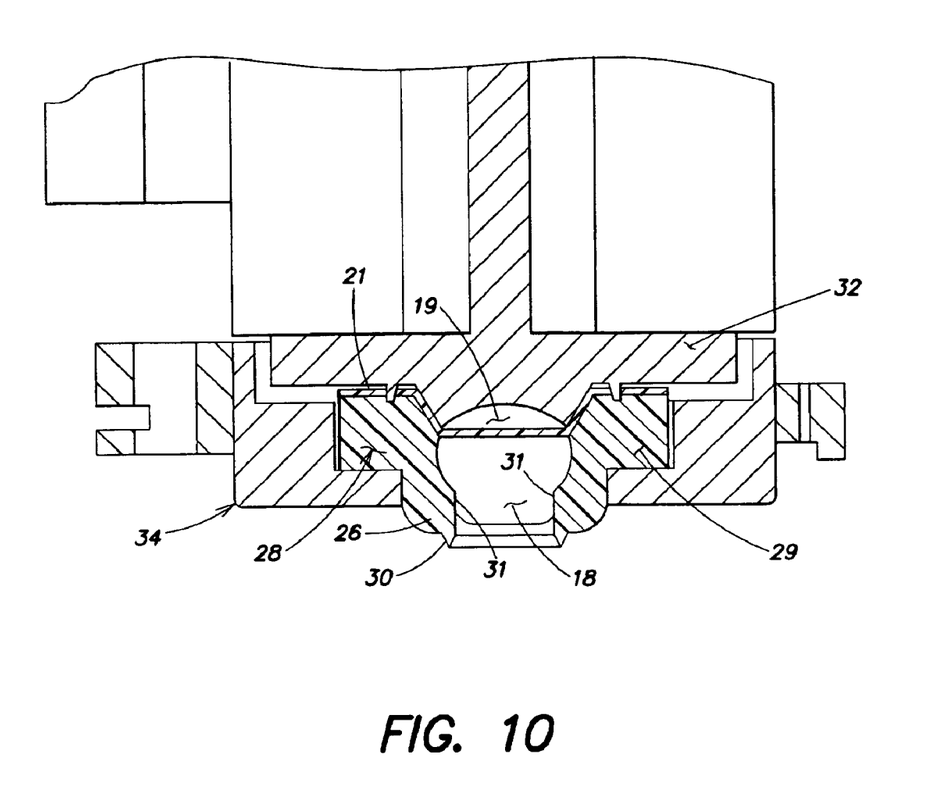
FIG. 10 is a magnified view of the print head of FIGS. 8 and 9.

Yet another embodiment of a print head is illustrated in FIGS. 8–10. This embodiment includes three cartridges 14 and three source ports 13, which provide more uniform distribution of viscous material along the length of the dispensing region 18.

Figure 12:
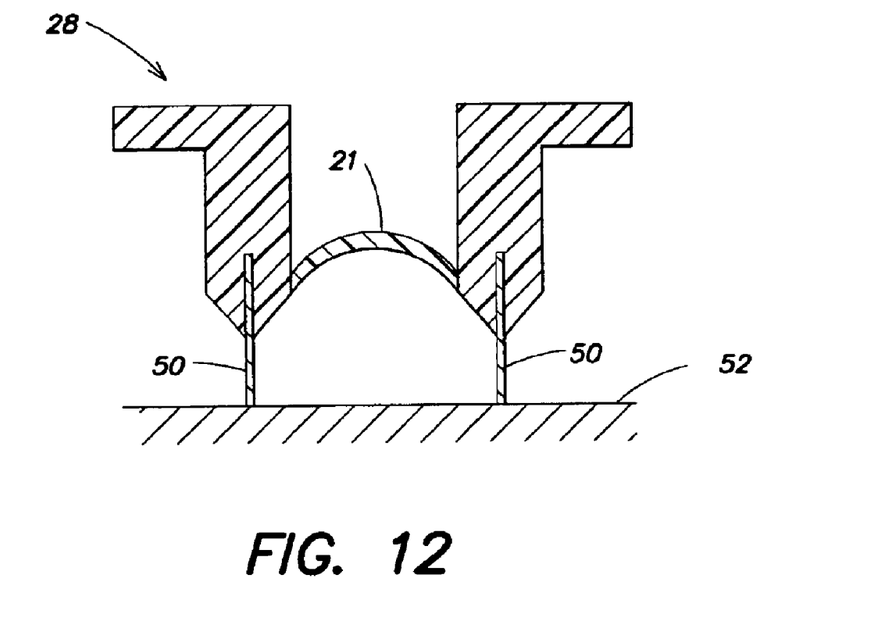
FIG. 12 illustrates a section of an envelope, wherein the blades include a pair of metal inserts.

As can be seen in FIG. 10, the removable envelope 28 includes a pair of vertically-oriented blades 26, which are an integral part of the envelope 28 and are likewise formed of an elastically deformable plastic. The blades 26 channel the viscous material onto a substrate passing beneath the dispensing slot defined by the blade tips 30. Each of the blades 26 has a length (perpendicular to the plane of the image in FIGS. 9 and 10) approximately equal to the length of the dispensing slot 24. The blades 26 also have inner, facing surfaces 31 that are substantially planar and parallel to each other. The blades 26 can be part of the envelope 28 (an integral part or a secured part); or, as shown in FIG. 12, the blades can be formed of thin sheets of metal 50 (e.g., spring steel) having a thickness of about 0.1 to about 0.25 mm (0.004 to 0.010 inches) and oriented parallel to one another. Where the blade 26 includes a metal insert 50 that defines the outlet passage of the dispensing region 18, the metal insert 50 can be embedded in the polymer portion envelope 28 by pre-positioning the metal insert 50 in a mold and casting the polymer around it.

Like the envelopes 28, described and illustrated above, the envelope 28 of FIGS. 9 and 10 comprises a deformable material, typically a polymer, such as polyurethane. The top, laterally extending portion of the envelope 28 forms a frame 29 that can be clamped between print head members 32 and 34. As is clearly illustrated in FIG. 10, the membrane 21 extends a central aperture in the frame 29. Blades 26 on each side of the dispensing region 18 extend away from the membrane 21 and they include substantially planar and parallel inner surfaces 31 through which the solder paste flows en route to the dispensing slot. At positions aligned with the source ports 13 (see FIG. 11), the envelope 28 includes collars (such as the collars 38, illustrated in FIGS. 6 and 7) that extend upward from the envelope frame 29 to engage the source ports 13, thereby providing an uninterrupted conduit through which viscous material can flow from a cartridge 14, through the source port 13, through the collar 38, through the frame 29 and into the envelope's dispensing region 18.

The tips 30 of the blade can be hard and may be formed of a high-durometric polyurethane, which can be molded with comparatively lower-durometric polyurethane for the remainder of the envelope by pouring sufficient high-durometric polyurethane into a mold, wherein the high-durometric polyurethane flows down to the lower region of the mold that shapes the tips. The lower-durometric polyurethane is then poured over the high-durometric polyurethane to fill the remainder of the mold to from the envelope. The combination of lower and higher durometric polyurethane can be provide a highly desirable degree of flexibility, wear resistance and sealing against the substrate during printing.

As discussed above, when the print head 12 is in the lowered printing position so that it is in contact with the stencil, the stencil printer operates by feeding solder paste 16 from the cartridge 14 into the dispensing region 18. With the dispensing region 18 filled with solder paste 14, the compressed gas source pumps gas into the activation region 19, thereby exerting pressure against the flexible membrane 21. The flexible membrane 21 is displaced toward the slot 24 as a result of this pressure, and solder paste 14 is thereby driven from the dispensing region 18 through the slot 24 and out of the chamber. The dispensed solder paste then flows onto a stencil positioned over a substrate, such as a printed circuit board, the solder flowing through apertures in the stencil onto the printed circuit board in a pre-defined pattern. In the printing position, the tips 30 at the end of the blades 26 contact the top surface of the stencil. For each direction that the print head 12 moves across the stencil, one of the two blades 26, which are oriented parallel to each other, will be a trailing blade and will scrape any excess solder paste off the stencil.

Figure 13:
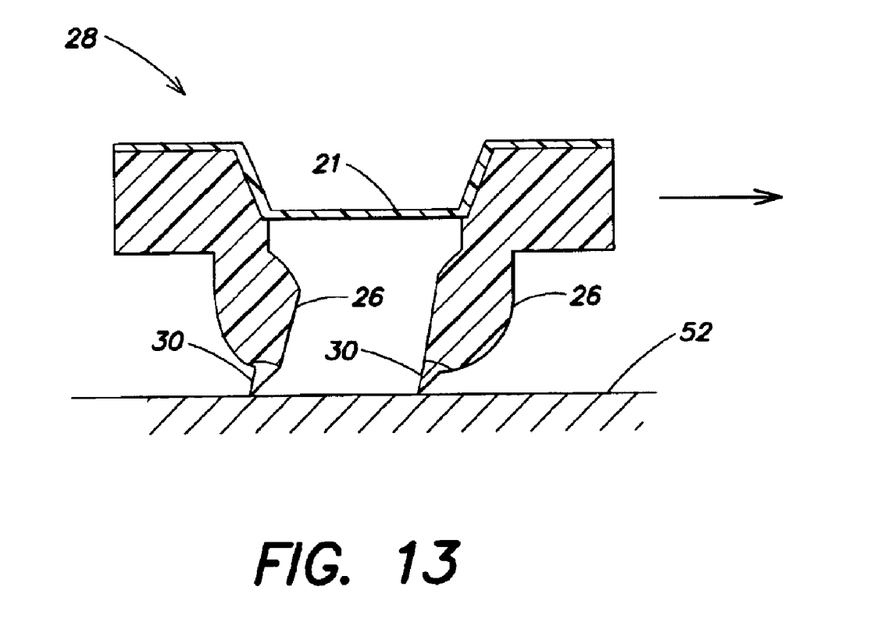
FIG. 13. is a sectioned illustration of an envelope during a print process wherein the blades are displaced to provide a squeegee effect.

Between the two blades 26, the solder paste 14 is pressurized. To prevent the pressurized solder paste 14 from breaking the seal formed at the interface of the tip 30 at the end of the trailing blade 26 and the stencil 52, force is applied to the print head 12 to press it against the stencil 52. The force can be applied via a pneumatic actuator. As the trailing tip 30 is pressed against the stencil 52, the blade 26 bends to function as a squeegee, with the tip 30 trailing its neutral position (relative to the rest of the blade 26) when the blade 26 is passing across the stencil 52. As an illustration, the direction that the print head is traveling is indicated with an arrow in FIG. 13 and the displacement of the blades 26 is opposite the direction of print-head travel. Depending on the durometer of the polyurethane that is used an on whether a metal insert is used, the degree of movement of the blades 30 during the print stroke may be adjusted and controlled.

At the end of a stroke across the stencil by the print head 12, the side of the blade 26 that was previously the trailing side becomes the leading side as the print head 12 is passed back across the stencil in the opposite direction. The tips 30 of the blades 26 are allowed to flip over to the new trailing sides of the blades 26 by raising the print head 12 at the end of a pass to allow the blades 26 to return to a neutral, centered orientation. As the print head 12 begins moving across the stencil in the opposite direction, the print head 12 is again lowered (via, e.g., the pneumatic actuator) to press it against the stencil, thereby causing the blades 26 to bend back, displacing the tips 30 in the direction of the new trailing sides of the blades 26.

A print head coupled with a control system is illustrated in FIG. 1. The control system includes a host computer 42 including a computer-readable storage medium coupled with a processor for executing software code stored on the storage medium. The processor is in communication with a cartridge gas pressure servo valve 44 and a bladder gas pressure servo valve 46. The valves 44 and 46 are coupled with a compressed gas source.

The processor sends instructions to each of the valves 44 and 46 to regulate the activation of the cartridges 14 for dispensing solder and to regulate the gas pressure in the activation region 19 of the print head. The processor is also in communication with one or more proxy sensors 48 for measuring the gas pressure in the dispensing region 18, which provides a feedback mechanism for the control system. The proxy sensors 48 relay the pressure measurements to the host computer 42, which sends instructions to the cartridge gas pressure servo valve 44 and to the bladder gas pressure servo valve 46 to control the flow of compressed gas to raise or lower the gas pressure in the activation region 19 to reach a desired target pressure.

Furthermore, the print head and associated apparatus, as illustrated in FIGS. 10 and 11 can be operated to withdraw solder paste back into displacement region 18 of the envelope 28 by dropping the pressure in the activation region 19 to create a vacuum that pulls the membrane 21 away from the stencil and expands the volume of the displacement region 18 to create a suction, as described, e.g., in U.S. Pat. No. 6,453,810.

Use of the displacement mechanism (e.g., the flexible membrane 21) allows for a print-head design where the displacement region 18 of the chamber can have a very small cross-section in planes perpendicular to the long axis of the chamber (i.e., the horizontal axis in FIG. 1), yet the solder paste 16 can still be dispensed substantially evenly through the slot 24 along its length. Use of a comparatively small dispensing region and the even flow of solder paste out of the chamber help to reduce or delay the onset of solder-paste compaction (i.e., the separation of flux from the solder particles). Moreover, the displacement mechanism enables highly responsive governance over the flow of solder paste 16 through the slot 24. When a burst of solder paste is needed (e.g., when the print head dispenses solder paste into a through-hole in a printed circuit board, for example), the proxy sensor 48 will read a decrease in pressure in the activation region 19. That decrease in pressure is then communicated to the host computer 42, which then sends a signal to the bladder gas pressure servo valve 46 to open the valve 46 to increase the pressure against the flexible membrane 21, thereby rapidly displacing solder paste 16 through the slot 24. In the absence of substantial force acting on the solder paste 16 in the cartridge 14, the flow of solder paste 16 through the slot 24 can be stopped by shutting down the compressed air source 25.

In other embodiments, viscous materials other than solder paste are printed using the apparatus and methods described above. In one embodiment, liquid epoxy is printed from the print head. Liquid epoxy can be used as an underfill for chip-scale packages, where the epoxy is deposited onto an area about 1 $cm^2$ on a printed circuit board, and the chip is then mounted onto the epoxy.

While this invention has been shown and described with references to particular embodiments thereof, those skilled in the art will understand that various changes in form and details may be made therein without departing from the scope of the invention, which is limited only by the following claims.

What is claimed is:

1. A stencil printer for printing one of solder paste, epoxy, glue and encapsulant on an electronic substrate, the stencil printer comprising:
   a stencil having apertures formed therein;
   a print head positioned over the stencil and constructed and arranged to deposit one of solder paste, epoxy, glue and encapsulant within the apertures of the stencil, the print head comprising:
      a housing defining a chamber;
      a source port defining a passage having an inlet positioned to allow one of solder paste, epoxy, glue and encapsulant to flow into the chamber;
      a pair of blades defining a slot that provides an outlet from which one of solder paste, epoxy, glue and encapsulant can flow out of the chamber; each blade being adapted to bend during a print stroke to solely function as a squeegee so as to force one of solder paste, epoxy, glue and encapsulant into the apertures in the stencil;
      a flexible membrane within the chamber, the flexible membrane segregating the chamber into a dispensing region and an activation region, where the print head is configured such that the passage defined by the source port is positioned to direct one of solder paste, epoxy, glue and encapsulant through a passage through the dispensing region and out the slot and on to the stencil to print one of solder paste, epoxy, glue and encapsulant on the electronic substrate; and a displacement mechanism positioned to displace the flexible membrane to reduce the volume of the dispensing region.

2. The stencil printer of claim 1, wherein the displacement mechanism includes a compressed gas source, and wherein the housing defines a passage through which compressed gas from the compressed gas source can be directed into the activation region of the chamber.

3. The stencil printer of claim 2, further comprising a controller coupled with the compressed gas source or with a valve positioned downstream from the compressed gas source for controlling the gas pressure in the activation region of the chamber.

4. The stencil printer of claim 1, wherein the print head comprises an envelope within the housing, the envelope defining the activation region and the dispensing region.

5. The stencil printer of claim 4, wherein the flexible membrane is hermetically secured to the envelope.

6. The stencil printer of claim 4, wherein the flexible membrane is an integral component of the envelope.

7. The stencil printer of claim 4, wherein the housing is separable to allow removal and replacement of the envelope.

8. The stencil printer of claim 4, wherein the envelope defines at least one passage coupling the source port with the dispensing region of the chamber.

9. The stencil printer of claim 1, wherein the flexible membrane includes a polymer selected from the group consisting of latex and silicone.

10. The stencil printer of claim 1, wherein the blades have inner surfaces that are substantially planar and parallel to one another.

11. A print head comprising:

a housing defining a chamber;

a source port defining a passage having an inlet positioned to allow a viscous material to flow into the chamber; and a pair of blades defining a slot that provides an outlet from which the viscous material can flow out of the chamber, wherein each of the blades comprises polyurethane and includes a substantially planar interior surface that is substantially parallel to the opposing substantially planar interior surface of the other blade, each blade comprising a tip at an end of the blade remote from the remainder of the print head, the tips being fabricated from high-durometric polyurethane that is harder than the remainder of the blades.

* * * * *